(12) United States Patent
Yamamoto et al.

(10) Patent No.: US 9,722,123 B2
(45) Date of Patent: Aug. 1, 2017

(54) SOLAR CELL

(71) Applicant: Kabushiki Kaisha Toshiba, Minato-ku (JP)

(72) Inventors: Kazushige Yamamoto, Kanagawa (JP); Naoyuki Nakagawa, Tokyo (JP); Soichiro Shibasaki, Tokyo (JP); Hiroki Hiraga, Kanagawa (JP); Mutsuki Yamazaki, Kanagawa (JP); Shinya Sakurada, Tokyo (JP); Michihiko Inaba, Kanagawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/220,428

(22) Filed: Mar. 20, 2014

(65) Prior Publication Data

US 2014/0290727 A1 Oct. 2, 2014

(30) Foreign Application Priority Data

Mar. 26, 2013 (JP) .................. 2013-064969

(51) Int. Cl.
*H01L 31/00* (2006.01)
*H01L 31/078* (2012.01)
(Continued)

(52) U.S. Cl.
CPC .......... *H01L 31/078* (2013.01); *H01L 31/068* (2013.01); *H01L 31/076* (2013.01);
(Continued)

(58) Field of Classification Search
CPC ... H01L 31/068; H01L 31/078; H01L 31/076; H01L 31/0749; Y02E 10/541; Y02E 10/547

USPC ......................................................... 136/255
See application file for complete search history.

(56) References Cited

U.S. PATENT DOCUMENTS 6,368,892 B1 * 4/2002 Arya ................... H01L 31/0322
257/E31.027
7,148,417 B1  12/2006 Landis
(Continued)

FOREIGN PATENT DOCUMENTS

JP        10-214986      8/1998
JP     10214986 A  *   8/1998
(Continued)

OTHER PUBLICATIONS

Tanaka et al., "Development of HIT solar cells with more than 21% conversion efficiency and commercialization of highest performance HIT modules", 3rd World Conference on Photovoltaic Energy Conversion, May 11-18, 2003.*
(Continued)

*Primary Examiner* — Luan Van
*Assistant Examiner* — Angelo Trivisonno
(74) *Attorney, Agent, or Firm* — Oblon, McClelland, Maier & Neustadt, L.L.P.

(57) ABSTRACT

A solar cell of an embodiment has a first solar cell, a second solar cell, and an intermediate layer between the first and second solar cells. The first solar cell has a Si layer as a light absorbing layer. The second solar cell has as a light absorbing layer one of a group I-III-VI$_2$ compound layer and a group I$_2$-II-IV-VI$_4$ compound layer. The intermediate layer has an n$^+$-type Si sublayer and at least one selected from a p$^+$-type Si sublayer, a metal compound sublayer, and a graphene sublayer. The metal compound sublayer is represented by MX where M denotes at least one type of element selected from Nb, Mo, Pd, Ta, W, and Pt and X denotes at least one type of element selected from S, Se, and Te.

16 Claims, 14 Drawing Sheets

(51) Int. Cl.
H01L 31/076 (2012.01)
H01L 31/068 (2012.01)
H01L 31/0749 (2012.01)

(52) U.S. Cl.
CPC ........ *H01L 31/0749* (2013.01); *Y02E 10/541* (2013.01); *Y02E 10/547* (2013.01)

(56) References Cited

U.S. PATENT DOCUMENTS

| | | | | |
|---|---|---|---|---|
| 2010/0006136 | A1* | 1/2010 | Zide | H01L 31/0687 136/244 |
| 2012/0103418 | A1* | 5/2012 | Chung | H01L 31/02168 136/262 |

FOREIGN PATENT DOCUMENTS

| | | | |
|---|---|---|---|
| JP | H10214986 A | * | 8/1998 |
| JP | 2000-58887 A | | 2/2000 |
| JP | 2010-34162 A | | 2/2010 |
| JP | 2012-89876 A | | 5/2012 |

OTHER PUBLICATIONS

Solanki, "Solar Photovoltaics: Fundamentals, Technologies and Applications", Prentice-Hall of India Pvt.Ltd (Dec. 1, 2009), ISBN-13: 978-8120337602.*

Ian Mathews, Donagh O'Mahony, Brian Corbett, and Alan P. Morrison, "Theoretical performance of multi-junction solar cells combining III-V and Si materials," Opt. Express 20, A754-A764 (2012).*

Tanaka, M., "Development of hit solar cells with more than 21% conversion efficiency and commercialization of highest performance hit modules," Photovoltaic Energy Conversion, 2003. Proceedings of 3rd World Conference on (vol. 1 ), May 18-18, 2003, 955-958 vol. 1.*

De et al., "Are There Fundamental Limitations on the Sheet Resistance and Transmittance of Thin Graphene Films?," ACS Nano, 2010, 4 (5), pp. 2713-2720, DOI: 10.1021/nn100343f.*

Mathews et al., "Theoretical performance of multi-junction solar cells combining III-V and Si materials," Optics Express vol. 20, Issue S5, pp. A754-A764 (2012), doi: 10.1364/OE.20.00A754.*

Wang et al., "Electronics and optoelectronics of two-dimensional transition metal dichalcogenides," Nature Nanotechnology 7, 699-712 (2012).*

Tanaka et al., "Development of HIT solar cells with more than 21% conversion efficiency and commercialization of highest performance HIT modules," Proceedings of 3rd World Conference on Photovoltaic Energy Conversion, 2003. (vol. 1 ), May 18, 2003, pp. 955-958.*

Nishiwaki et al., "MoSe2 layer formation at Cu(In,Ga)Se2/Mo Interfaces in High Efficiency Cu(In1-xGax)Se2 Solar Cells," Jpn. J. Appl. Phys. vol. 37 (1998) pp. L 71-L 73.*

English machine translation of JPH10214986, accessed 2015.*

Office Action issued on May 31, 2016 in Japanese Patent Application No. 2013-064969 with English translation.

* cited by examiner

SOLAR CELL

CROSS-REFERENCE TO RELATED APPLICATION

This application is based upon and claims the benefit of priority from Japanese Patent Application No. 2013-064969 Mar. 26, 2013; the entire contents of which are incorporated herein by reference.

FIELD

Embodiments described herein relate generally to solar cell.

BACKGROUND

As an example of renewable power sources, there is photovoltaic power generation, which is not highly popularized yet. To further spread the use of photovoltaic power generation needs reduction in power generation cost, and this reduction requires increase in the efficiency and lowering of cost for solar cells. The known solar cells which are actually used now are ones of monocrystalline Si, polycrystalline Si, amorphous Si, chalcopyrite compounds such as CIGS (copper indium gallium selenide), and CdTe. While these solar cells have been reduced in cost, the efficiency cannot be increased enough because of the single junction structure thereof and the highest possible efficiency achieved so far is in the low 20-percent range.

As a solar cell that can have higher efficiency, a multi-junction solar cell is being proposed. Specifically, for a triple junction solar cell with a laminated structure of 3 thin films respectively having 3 types of group III-V compounds (InGaP/GaAs/InGaAs), a high efficiency of 37.7%, which exceeds the theoretical limit for single junction solar cells, is achieved. The group III-V compound thin films, however, need to be formed by epitaxial growth, which requires an expensive manufacturing device for MOCVD (metal organic chemical vapor deposition), for example. Accordingly, the watt unit price (manufacturing cost divided by power generation amount) as a parameter of solar cell manufacturing cost is two to three orders of magnitude higher for the triple junction solar cells of the group III-V compound thin films than that for single junction solar cells. The power generation cost, which the applicants discuss herein as a key issue, is therefore orders of magnitude higher for the triple junction solar cells than that for single junction solar cells.

As a candidate of future solar cells which can achieve higher efficiency and lower cost at one time, concentrating solar cells are being proposed. The advantage of the concentrating solar cells is that the area of a panel can be smaller because of high efficiency of light collecting. The disadvantages are that a light collector has a complicated, heavy, and large structure if a large-size lens or reflecting mirror is used for collecting light and a sunlight tracking device is additionally necessary. The disadvantages lead to extremely high cost of power generation, contrary to our expectation.

DETAILED DESCRIPTION

Figure 1:
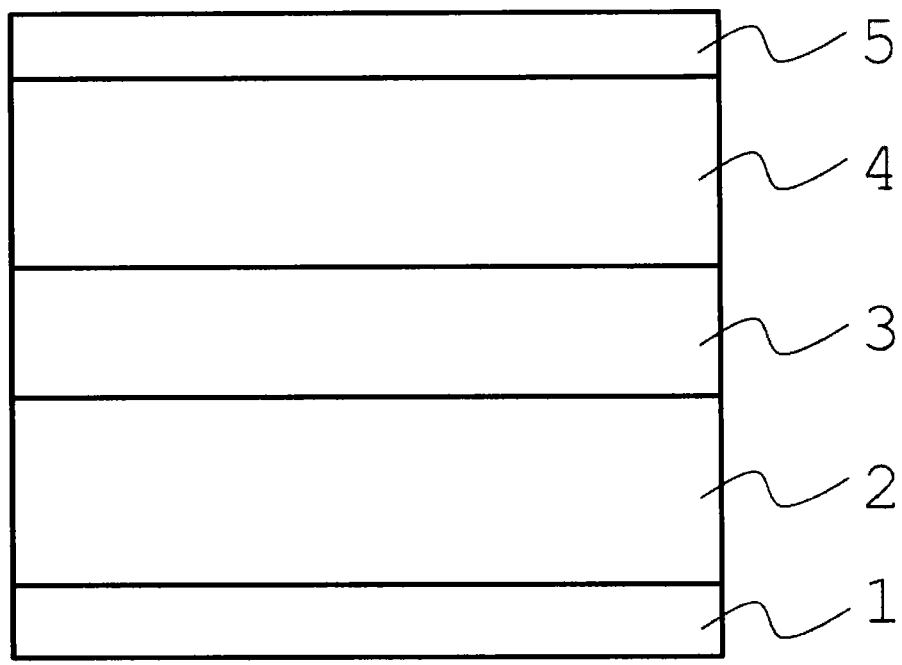
FIG. 1 is a cross-sectional conceptual diagram illustrating a solar cell according to an embodiment.

A solar cell of an embodiment includes a first solar cell, a second solar cell, and an intermediate layer between the first and second solar cells. The first solar cell includes a Si layer as a light absorbing layer. The second solar cell includes as a light absorbing layer one of a group $I-III-VI_2$ compound layer and a group $I_2-II-IV-VI_4$ compound layer. The intermediate layer includes an $n^+$-type Si sublayer and at least one selected from a $p^+$-type Si sublayer, a metal compound sublayer, and a graphene sublayer. The metal compound sublayer is represented by MX where M denotes at least one type of element selected from Nb, Mo, Pd, Ta, W, and Pt and X denotes at least one type of element selected from S, Se, and Te.

An embodiment of the present disclosure will be hereinafter described using examples with reference to the drawings. The longitudinal relations of the components in the specification correspond to those in the drawings.

A solar cell according to an embodiment is a tandem solar cell including a back electrode 1, a first solar cell 2, an intermediate layer 3, and a second solar cell 4 in that order. On the second solar cell 4, a transparent electrode 5 is placed. In the specification, p, n, and i denote conductivity types, i representing both of a case containing no dopants and a case containing p-type and n-type dopants in equal amounts. Further, c and a denote the crystallinities of silicon, c representing a crystalline property and a representing an amorphous property.

The first solar cell 2 according to the embodiment, which is formed on the back electrode 1, has a Si layer as a light absorbing layer and serves as a bottom cell of the tandem solar cell. The second solar cell 4 is formed on the back electrode 1. Since being a bottom cell, the first solar cell 2 preferably has a narrow-gap light absorbing layer. As the first solar cell 2, a monocrystalline silicon solar cell, a polycrystalline silicon solar cell, a thin film silicon solar cell, for example, may be used.

Examples of the first solar cell 2 with high efficiency include a cell placed on the back electrode 1 and provided with a laminated structure of a p-type amorphous Si (p (aSi) layer, an i-type amorphous Si (i (aSi)) layer, a crystalline Si (cSi) layer, an i-type amorphous Si (i (aSi)) layer, and an n-type amorphous Si (n (aSi)) layer in that order. The (cSi) layer is of either p-type or n-type and the concentration of the dopant for the (cSi) layer is lower than the respective concentrations of the dopants for the p-type aSi and n-type aSi layers. The presence of the i-type silicon layer between the crystalline Si layer and one of the p-type layer and the n-type layer serves to prevent recombination of carriers. A solar cell using the first solar cell 2 as described above as an example will be illustrated in the conceptual diagrams of FIG. 11 to FIG. 13.

The second solar cell 4 according to the embodiment is the top cell of the tandem solar cell. Since being a top cell, the second solar cell 4 preferably has a wide-gap light absorbing layer. The second solar cell 4, which is formed on the transparent electrode 5, is a p-n-junction photoelectric conversion layer including a p-type semiconductor sublayer 4A as a light absorbing layer and an n-type buffer sublayer 4B on the semiconductor sublayer 4A, the sublayer 4A being of either a group I-III-VI$_2$ compound (chalcopyrite compound) or a group I$_2$-II-IV-VI$_4$ compound (kesterite compound or austenite compound). The second solar cell 4 may be a homo-type or a hetero-type. If the second solar cell 4 is a hetero-type, a semiconductor layer of ZnMgO, ZnS, or n-aSi, for example, may be employed as the buffer layer 4B according to conditions of the compound of the p-type sublayer 4A, for example Of the group I-III-VI$_2$ compound, Cu is desirable for the group I element, and at least one element of Al, In, and Ga is desirable for the group III element, and at least one element of S, Se, and Te is desirable for the group VI element. When a silicon-based cell is used as the bottom cell, $CuAl_xGa_{1-x}Se_2$, for example, is preferably used for the group I-III-VI$_2$ compound semiconductor sublayer 4A of the second solar cell 4.

Of the group I$_2$-II-IV-VI$_4$ compound, Cu is desirable for the group I element, and Zn is desirable for the group II element, and at least one element of Ge and Sn is desirable for the group IV element, and at least one element of S, Se, and Te is desirable for the group VI element. For the group I-III-VI$_2$ compound semiconductor sublayer 4A of the second solar cell 4, $Cu_2ZnGeSe_xS_{4-x}$, for example, is preferably used.

Subsequently, descriptions will be made of the intermediate layer (contact layer) 3 of the tandem solar cell including a lamination of the Si-based solar cell 2 and the solar cell 4 of the group I-III-VI$_2$ compound or the group I$_2$-II-IV-VI$_4$ compound. The necessity will be described first of the intermediate layer 3 for increasing the efficiency of the tandem solar cell. Next, the role of the intermediate layer 3 will be described, and thereafter the descriptions will be made of the structure of the intermediate layer 3 that is compatible with both Si and one of the group I-III-VI$_2$ compound and the group I$_2$-II-IV-VI$_4$ compound.

It is well known that Si, the group I-III-VI$_2$ compound, and the group I$_2$-II-IV-VI$_4$ compound each acts as a single single junction solar cell, although only lamination of the above materials attains low efficiency. In order to allow a tandem solar cell to demonstrate higher efficiency, the intermediate layer 3 needs to be newly interposed between the laminated photoelectric conversion layers (first and second cells).

The absence of the intermediate layer 3 in the tandem solar cell reduces the efficiency of the tandem solar cell because counter-electromotive force generates due to a p-n junction between the laminated cells. In the tandem solar cell without the intermediate layer 3, not only electromotive force generates in each of the top cell and the bottom cell but also reversed electromotive force (counter-electromotive force) generates between the first solar cell 2 and the second solar cell 4. The counter-electromotive force occurs in a direction that cancels out the electromotive force in each cell and therefore reduces the electromotive force in the entire tandem solar cell. This is the reason for reduction in the efficiency occurred in a case where the solar cells are laminated without the intermediate layer 3 in between. The direction of the p-n junction in each cell and the direction of the p-n junction between the cells are opposite to each other. In other words, the intermediate layer 3 is a contact layer.

The role of the intermediate layer 3 is to prevent occurrence of short-circuit between the cells in order to avoid generation of counter-electromotive force. The intermediate layer 3 is formed to have a tunnel junction or a conductor layer (low-resistive layer), for example, in which counter-electromotive force is difficult to generate. It is to be noted that the intermediate layer 3 needs to be optimally employed according to one selected from possible combinations of the materials of the cells. In the meanwhile, no reports have been found on intermediate layers that can offer high conversion efficiency and low cost for tandem solar cells including a Si-based cell and a cell of a group I-III-VI$_2$ compound or a group I$_2$-II-IV-VI$_4$ compound. In view of the above circumstances, there is a need for developing a new structure of the intermediate layer 3 that is optimum for a tandem solar cell in terms of the conversion efficiency and cost, the tandem solar cell including a lamination of the cell with the Si-based photoelectric conversion layer and the cell with the group I-III-VI$_2$ compound or I$_2$-II-IV-VI$_4$ compound semiconductor layer.

Other than a requirement for prevention of counter-electromotive force generation, the intermediate layer 3 has a large number of requirements that the layer 3 needs to satisfy. One of them is that it is inappropriate to use for the intermediate layer 3 a thick metal film so thick as to reduce the intensity of light incoming to the first solar cell 2 near the bottom. Because the use of a sublayer with a small index of refraction for the intermediate layer 3 increases the amount of reflecting light at the interfaces between the cells and the intermediate layer 3, a transparent oxide with a small index of refraction, for example, is not suitable. The intermediate layer 3 has to form an excellent contact with the p-type sublayer 4A of the second solar cell 4 and the n-type sublayer 2B of the first solar cell 2. Further another requirement, which is a manufacturing requirement, is that the intermediate layer 3 and the first solar cell 2 must not break down under high temperature condition (for example, 500° C. to 600° C.) at formation of the light absorbing layer of the second solar cell 4.

After various studies on the intermediate layer 3 of the tandem solar cell with a lamination of Si and a group I-III-VI$_2$ compound (and of Si and a group I$_2$-II-IV-VI$_4$ compound) under the above condition, the inventors of the present disclosure have found that the configurations illustrated in the conceptual diagrams of FIG. 2 to FIG. 8, for example, achieve high-efficiency operations. The intermediate layer 3 according to the embodiment has a laminated structure of the n$^+$-type Si sublayer 3A and at least one of the p$^+$-type Si sublayer 3B, the metal compound sublayer 3C, and the graphene sublayer 3D, between the first solar cell 2 and the second solar cell 4.

A first structure of the intermediate layer 3 is a tunnel junction of a lamination of the n$^+$-type Si sublayer (heavily-doped n-type Si sublayer) 3A and the p⁺-type Si sublayer (heavily-doped p-type Si sublayer) 3B, as illustrated in the conceptual diagrams of FIG. 2 to FIG. 5. A second structure of the intermediate layer 3 is a structure in which the metal compound sublayer 3C is laminated on the n⁺-type Si sublayer 3A, as illustrated in the conceptual diagrams of FIG. 6 to FIG. 8. The n⁺-type Si sublayer 3A is formed on the n-type sublayer 2B of the first solar cell 2, and the p⁺-type Si sublayer 3B or the metal compound sublayer 3C is formed on the p-type sublayer 4A of the second solar cell 4.

The intermediate layer 3 with the first structure enables current flow from the n⁺-type Si sublayer 3A to the p⁺-type Si sublayer 3B in the intermediate layer 3. Moreover, the intermediate layer 3 with the second structure enables current flow from the n⁺-type Si sublayer 3A to the p⁺-type Si sublayer 3B in the intermediate layer 3 by its laminated structure of the n⁺-type Si sublayer 3A and the p⁺-type Si sublayer 3B. The first and second structures of the intermediate layer 3 are characterized in that a low-resistive contact (short-circuit) is formed between the p-type sublayer 4A of the second solar cell 4 and the p⁺-type Si sublayer 3B of the intermediate layer 3 in contact with the p-type sublayer 4A.

The crystallinities of the n⁺-type Si sublayer 3A and the p⁺-type Si sublayer 3B of the intermediate layer 3 are not particularly limited, and the n⁺-type Si sublayer 3A and the p⁺-type Si sublayer 3B are each a crystalline or amorphous silicon layer. The sublayers 3A and 3B with either crystallinity form excellent contacts with the solar cells in contact with the sublayers 3A and 3B. The doping concentration for each sublayer is as high as in the range of $10^{19}/cm^3$ and $10^{21}/cm^3$, both inclusive, for example, and preferably is in the range of $10^{20}/cm^3$ and $10^{21}/cm^3$, both inclusive.

Further, the metal compound sublayer 3C of the intermediate layer 3 is a conductor layer (or a low-resistive layer) of a metal compound in the form of a thin film represented by MX where M denotes at least one element selected from Nb, Mo, Pd, Ta, W, and Pt and X denotes at least one element selected from S, Se, and Te. The metal compound sublayer 3C forms an excellent contact with the solar cell as well. In the meanwhile, the graphene sublayer 3D of the intermediate layer 3 is formed of a conductive (low-resistive) material. The graphene sublayer 3D also forms an excellent contact with the solar cell. An example of a solar cell including the graphene sublayer 3D is illustrated in the conceptual diagram of FIG. 14.

A solar cell was prepared having a laminated structure of the n⁺-type Si sublayer 3A and at least one selected from the p⁺-type Si sublayer 3B, the metal compound sublayer 3C, and the graphene sublayer 3D, and examinations for checking the characteristics of the prepared cell were carried out. The inventors have confirmed from the examinations that an excellent photoelectric conversion efficiency is obtained for the solar cell using the intermediate layer 3 with the above configurations. Since a high electromotive force is observed at the use of the intermediate layer 3 thus configured, an excellent ohmic contact seems to be formed between the p-type semiconductor sublayer 4A of the second solar cell 4 and the p⁺-type Si sublayer 3B of the intermediate layer 3. Hence, the intermediate layer 3 with any configuration is connected to the second solar cell 4 at high conductivity levels.

The sublayers of the intermediate layer 3 are 5 nm to 50 nm in thickness, both inclusive, and are preferably 5 nm to 20 nm in thickness, both inclusive. Too small thicknesses of the sublayers are not desirable in terms of film formation and too large thicknesses are not desirable in terms of light transmission properties.

Next, the descriptions will be made of exemplary combinations for the intermediate layer 3. The solar cell including the intermediate layer 3 according to the embodiment will be conceptually illustrated in FIG. 2 to FIG. 8.

Figure 2:
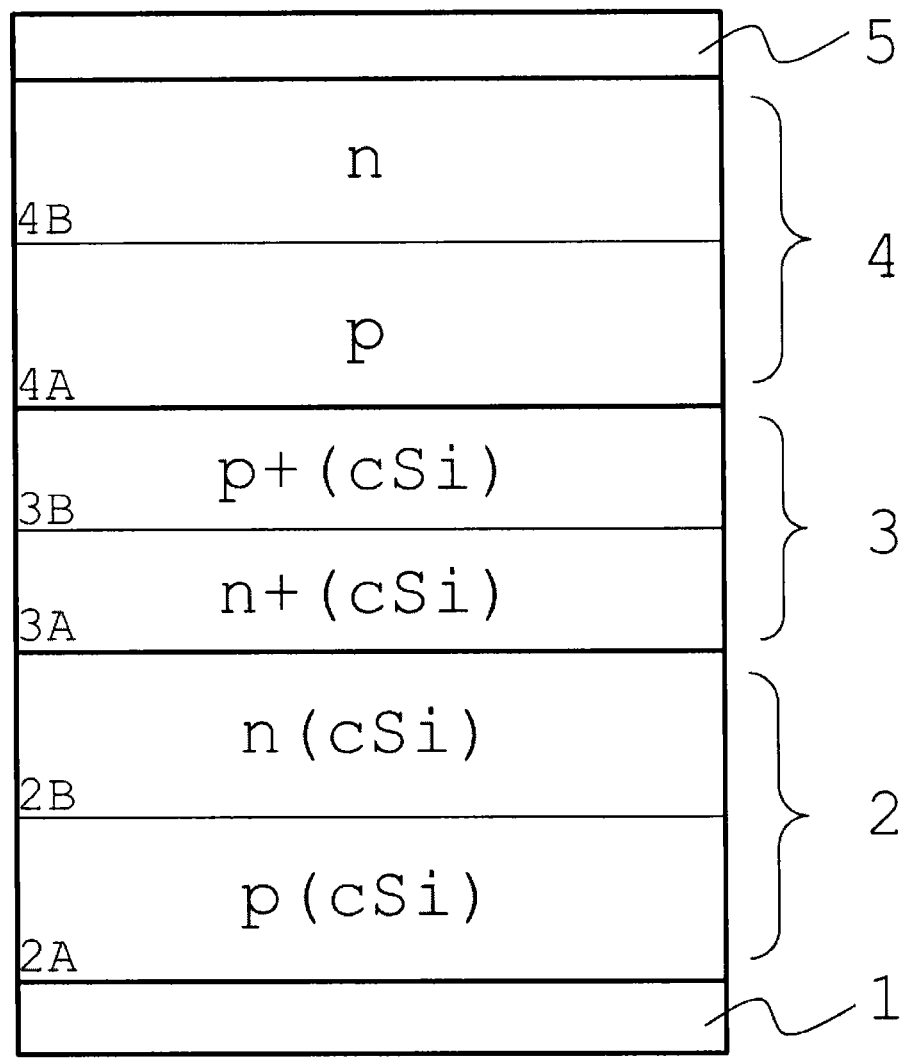
FIG. 2 is a cross-sectional conceptual diagram illustrating a solar cell according to an embodiment.

A solar cell of FIG. 2 has a first structure in which on the back electrode 1, there are sequentially laminated a crystalline p-type Si (p (cSi)) sublayer 2A, a crystalline n-type Si (n (cSi)) sublayer 2B, the crystalline n⁺-type Si (n⁺ (cSi)) sublayer 3A, the crystalline p⁺-type Si (P⁺ (cSi)) sublayer 3B, the p-type sublayer 4A of I-III-VI₂ or I₂-II-IV-VI₄, the n-type sublayer 43 of I-III-VI₂ or I₂-II-IV-VI₄, and the transparent electrode 5, the Si (p (cSi)) sublayer 2A and the (n (cSi)) sublayer 2B forming the first solar cell 2, the (n⁺ (cSi)) sublayer 3A and the (P⁺ (cSi)) sublayer 3B forming the intermediate layer 3, and the p-type sublayer 4A and the n-type sublayer 4B forming the second solar cell 4.

Figure 3:
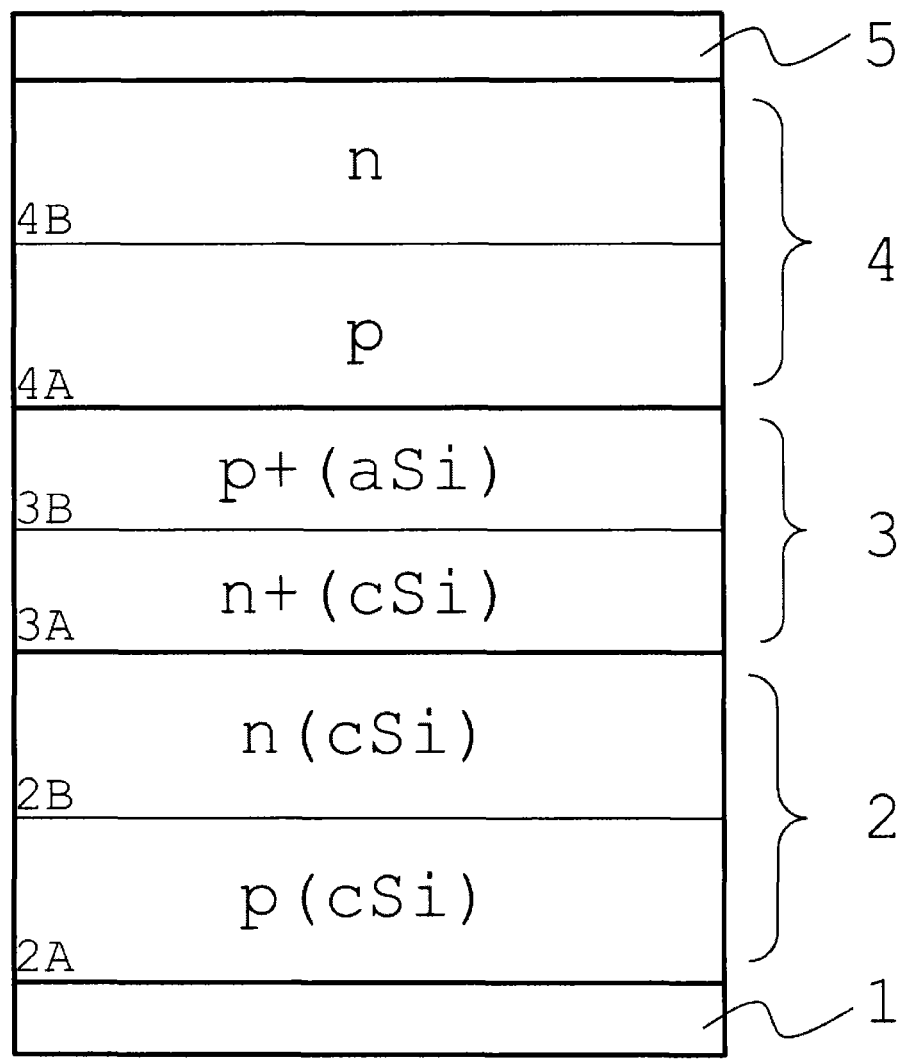
FIG. 3 is a cross-sectional conceptual diagram illustrating a solar cell according to an embodiment.

A solar cell of FIG. 3 has a first structure with a p⁺-type amorphous Si (p⁺ (aSi)) layer used as the p⁺-type Si sublayer 3B of the intermediate layer 3, and is similar to that of FIG. 2 other than in that respect.

Figure 4:
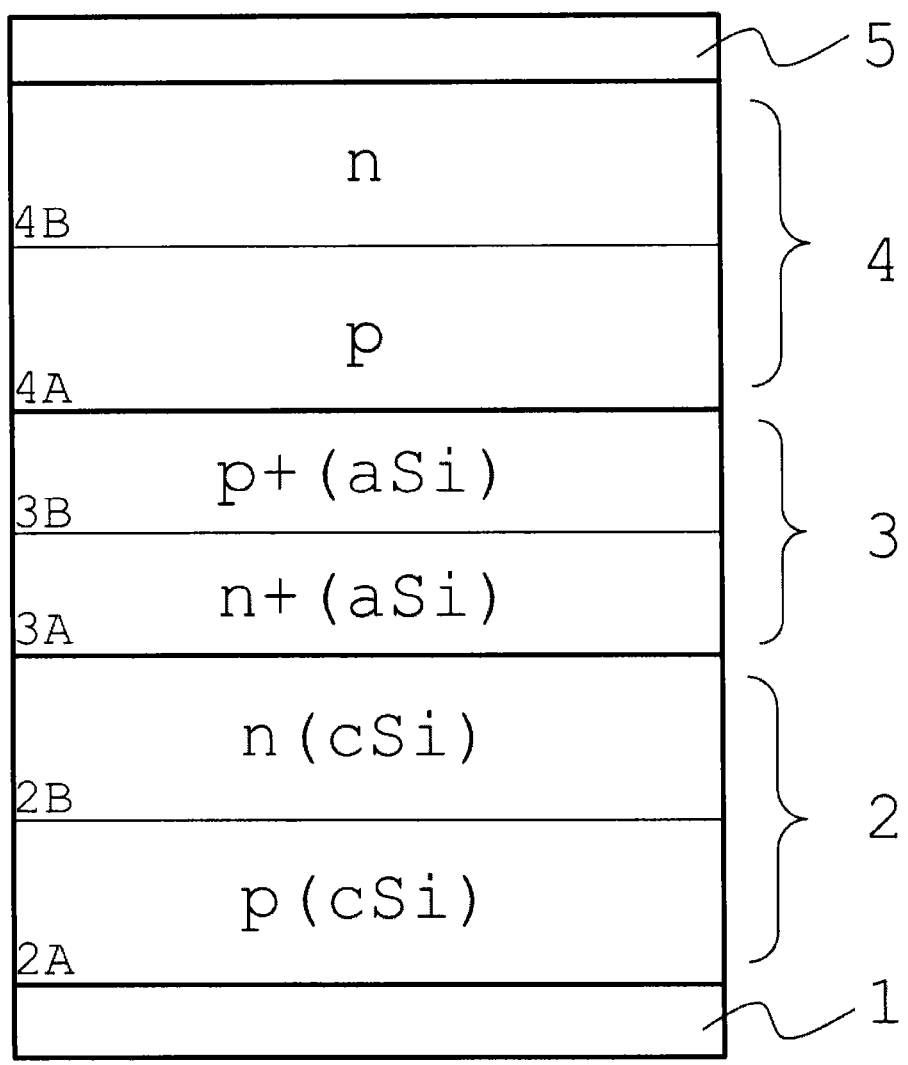
FIG. 4 is a cross-sectional conceptual diagram illustrating a solar cell according to an embodiment.

A solar cell of FIG. 4 has a first structure with an n⁺-type amorphous Si (n⁺ (aSi)) layer used as the n⁺-type Si sublayer 3A of the intermediate layer 3, and is similar to that of FIG. 3 other than in that respect.

Figure 5:
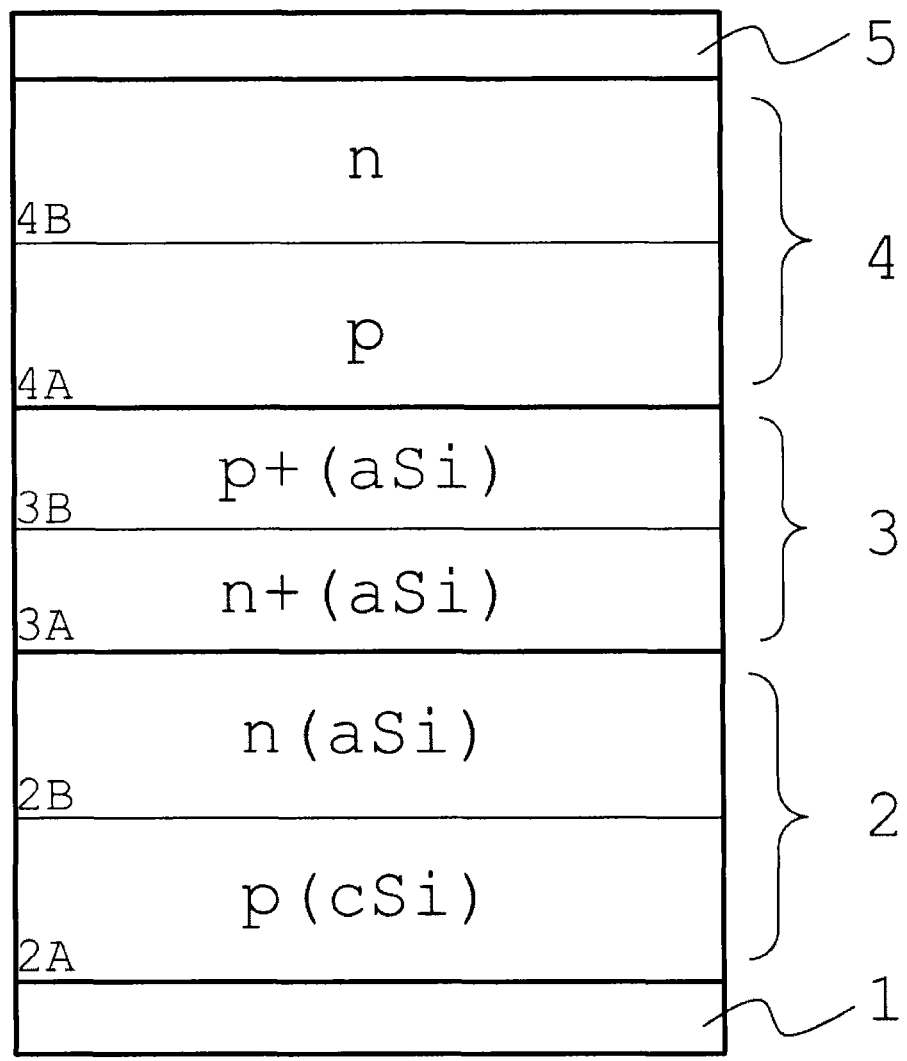
FIG. 5 is a cross-sectional conceptual diagram illustrating a solar cell according to an embodiment.

A solar cell of FIG. 5 has a first structure with an n⁺-type amorphous Si (n⁺ (aSi)) layer used as the n-type sublayer 2B of the first solar cell 2, and is similar to that of FIG. 4 other than in that respect.

Figure 6:
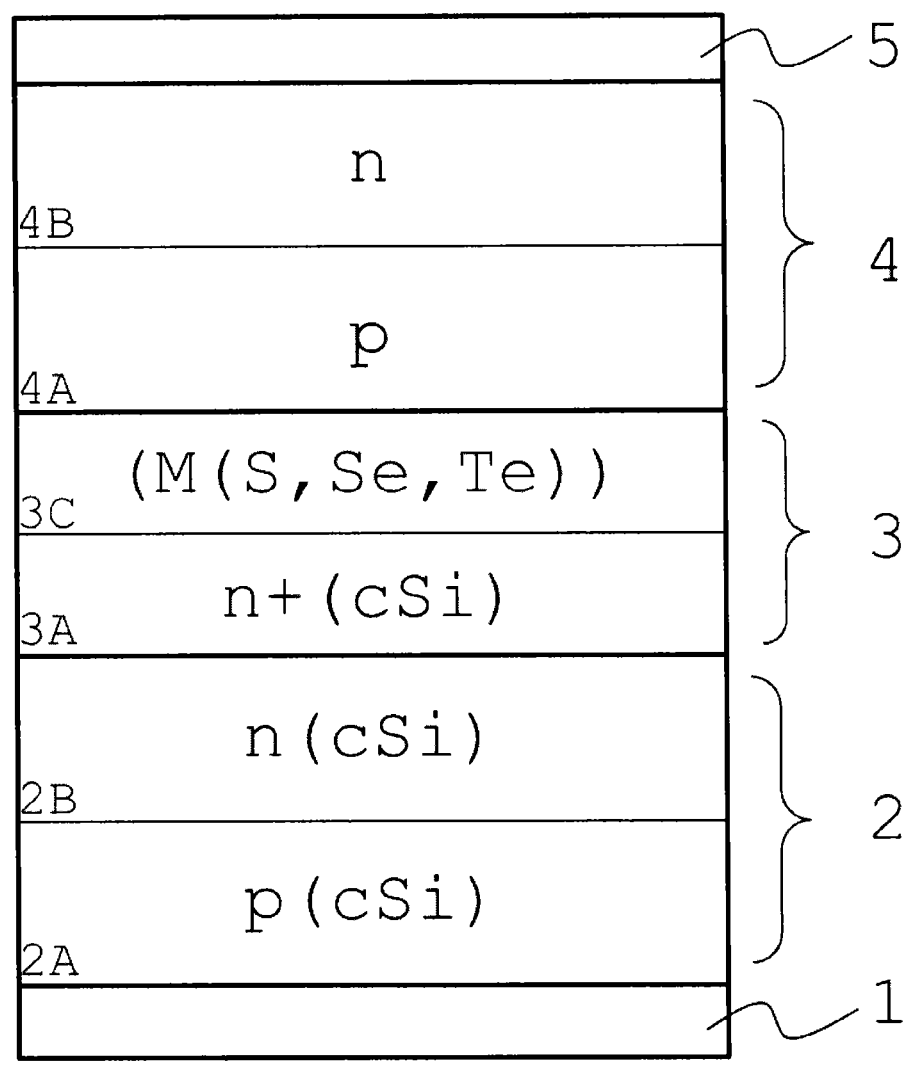
FIG. 6 is a cross-sectional conceptual diagram illustrating a solar cell according to an embodiment.

A solar cell of FIG. 6 has the second structure with a p⁺-type metal compound (M (S, Se, Te)) sublayer 3B used as the p-type sublayer of the intermediate layer 3, and is similar to that of FIG. 2 other than in that respect.

Figure 7:
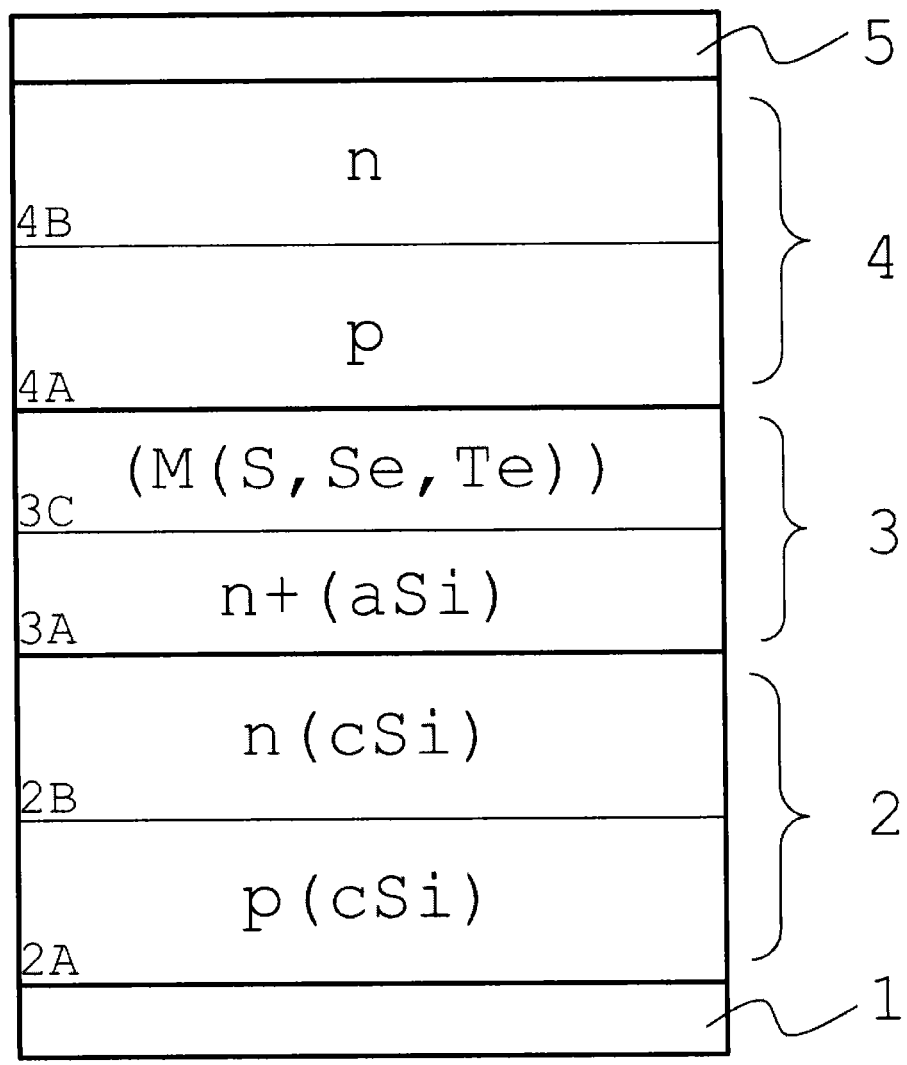
FIG. 7 is a cross-sectional conceptual diagram illustrating a solar cell according to an embodiment.

A solar cell of FIG. 7 has the second structure with an n⁺-type amorphous Si (n⁺ (aSi)) sublayer 3A used as the n-type sublayer of the intermediate layer 3, and is similar to that of FIG. 6 other than in that respect.

Figure 8:
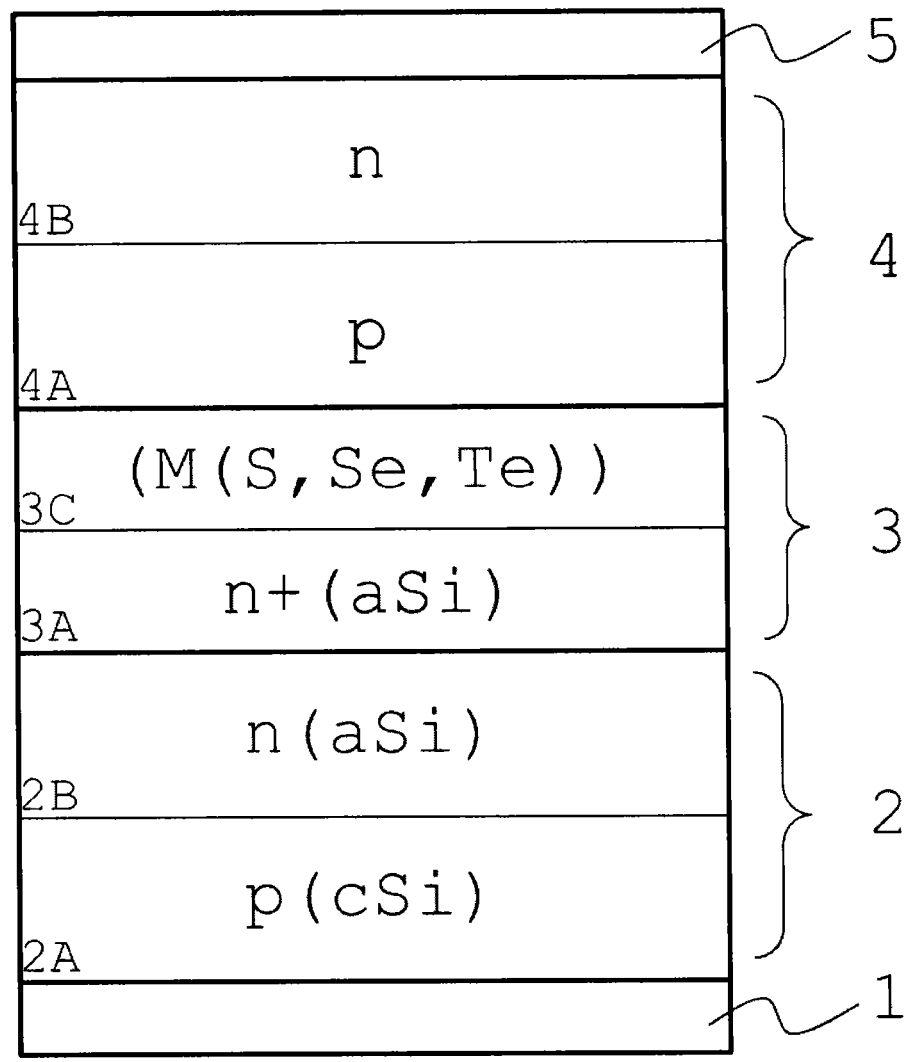
FIG. 8 is a cross-sectional conceptual diagram illustrating a solar cell according to an embodiment.

A solar cell of FIG. 8 has the second structure with an n-type amorphous Si (n (aSi)) sublayer 2B used as the n-type sublayer of the first solar cell 2, and is similar to that of FIG. 7 other than in that respect.

The application of the intermediate layer 3 with the above structures makes it possible to realize a previously unknown tandem solar cell that simultaneously attains high efficiency and low cost, the cell including a lamination of the first solar cell 2 and the second solar cell 4 of a group I-III-VI₂ compound solar cell or a group I₂-II-IV-VI₄ compound solar cell.

The back electrode 1 according to the embodiment may be an Al electrode, for example, formed on a substrate. The transparent electrode 5 according to the embodiment may be formed of ZnO, ITO (Indium tin oxide), FTO (fluorine doped tin oxide), etc. The n-type sublayer of the intermediate layer 3 may be a graphene layer, although not shown in the drawings. Further, the solar cell of the embodiment may additionally include an extracting electrode, a reflection reducing film, and so forth, which solar cells generally include. Arrangement of more than one solar cell according to the embodiment can make a solar module. The solar module may be used as a solar power system employing a converter such as a power conditioner.

Figure 9:
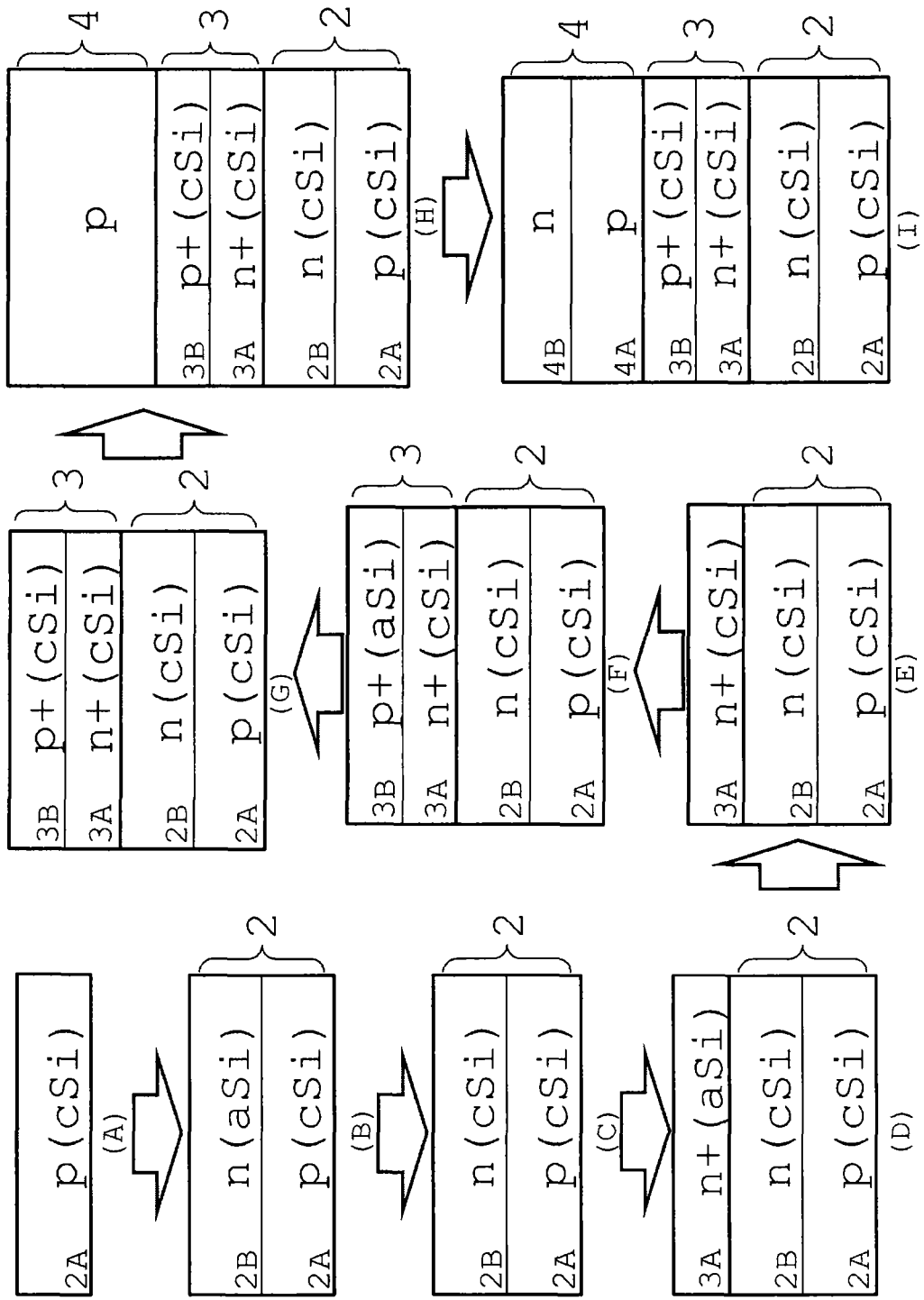
FIG. 9 is a cross-sectional conceptual diagram illustrating manufacturing processes of a solar cell according to an embodiment.

Next, a method for manufacturing the solar cell according to the embodiment will be described with reference to FIG. 9A to FIG. 9I which show a cross-sectional conceptual diagram illustrating manufacturing processes of the solar cell. Herein, the solar cell of FIG. 2 will be described as an example. FIG. 9A is a cross-sectional conceptual diagram illustrating the p-type crystalline Si sublayer 2A of the first solar cell 2. Note that the second solar cell 4 will be a homo-junction cell in the following descriptions.

FIG. 9B shows a process in which the n-type amorphous Si (n (aSi)) sublayer 2B is deposited on the member in FIG. 9A. The n-type amorphous Si sublayer 2B can be deposited by, for example, a PE-CVD (plasma-enhanced chemical vapor deposition) method or a sputtering method. As the n-type amorphous Si sublayer 2B, a Si sublayer may be made n-type after being deposited. Further, prior to deposition of the n-type amorphous Si sublayer 2B, an i-type amorphous Si layer may be deposited. Moreover, an i-type Si layer and a p-type Si layer may be deposited on a surface of the p-type crystalline Si sublayer 2A which is opposite to the n-type amorphous Si sublayer 2B.

FIG. 9C shows a process in which the n-type amorphous Si sublayer 2B in FIG. 9B is crystallized (n (cSi)). For the crystallization of the n-type amorphous Si sublayer 2B, excimer laser annealing, plasma annealing, or vacuum annealing, for example, may be used. Note that this process will be omitted in manufacturing the solar cell of FIG. 5.

FIG. 9D shows a process in which the heavily-doped $n^+$-type amorphous Si ($n^+$ (aSi)) sublayer 3A is deposited on the n-type crystalline Si sublayer 2B in FIG. 9C. The method for the deposition is similar to that for the process in FIG. 9B.

FIG. 9E shows a process in which the $n^+$-type amorphous Si sublayer 3A in FIG. 9D is crystallized ($n^+$ (cSi)). The method for the crystallization and the processing omission are similar to those for the process in FIG. 9C.

FIG. 9F shows a process in which the heavily-doped $p^+$-type amorphous Si ($p^+$ (aSi)) sublayer 3B is deposited on the $n^+$-type crystalline Si sublayer 3A in FIG. 9E. The method for the deposition is similar to that for the process in FIG. 9B.

FIG. 9G shows a process in which the $p^+$-type amorphous Si sublayer 3B in FIG. 9F is crystallized ($p^+$ (cSi)). The method for the crystallization and the processing omission are similar to those for the process in FIG. 9C.

FIG. 9H shows a process in which a p-type compound semiconductor layer of the second solar cell 4 is formed on the $p^+$-type crystalline Si sublayer 3B in FIG. 9G. The deposition of the p-type compound semiconductor layer can be carried out by forming a material of elements other than group VI elements into a film by a sputtering method and then processing the film with a gas of a group VI element, for example.

FIG. 9I shows a process in which the upper part of the p-type compound semiconductor layer in FIG. 9H is converted into n-type. This conversion of the layer from a p-type into an n-type can be performed by processing the surface of the compound semiconductor layer with a liquid-phase doping method, for example. The compound semiconductor layer is divided into the p-type sublayer 4A and the n-type sublayer 4B by the conversion of the semiconductor layer into an n-type. In the end, the back electrode 1 and the transparent electrode 5 are formed, so that the solar cell of FIG. 2 can be obtained.

Next, a method for manufacturing the solar cell according to the embodiment will be described with reference to FIG. 10A to FIG. 10C which show a cross-sectional conceptual diagram illustrating the manufacturing processes of a solar cell. Herein, the solar cell of FIG. 6 will be described as an example. Descriptions of the processes shown in from FIG. 9A to FIG. 9E will be omitted in order to avoid repetition of the above descriptions. Note that the second solar cell 4 will be a hetero-junction cell in the following descriptions.

Figure 10:
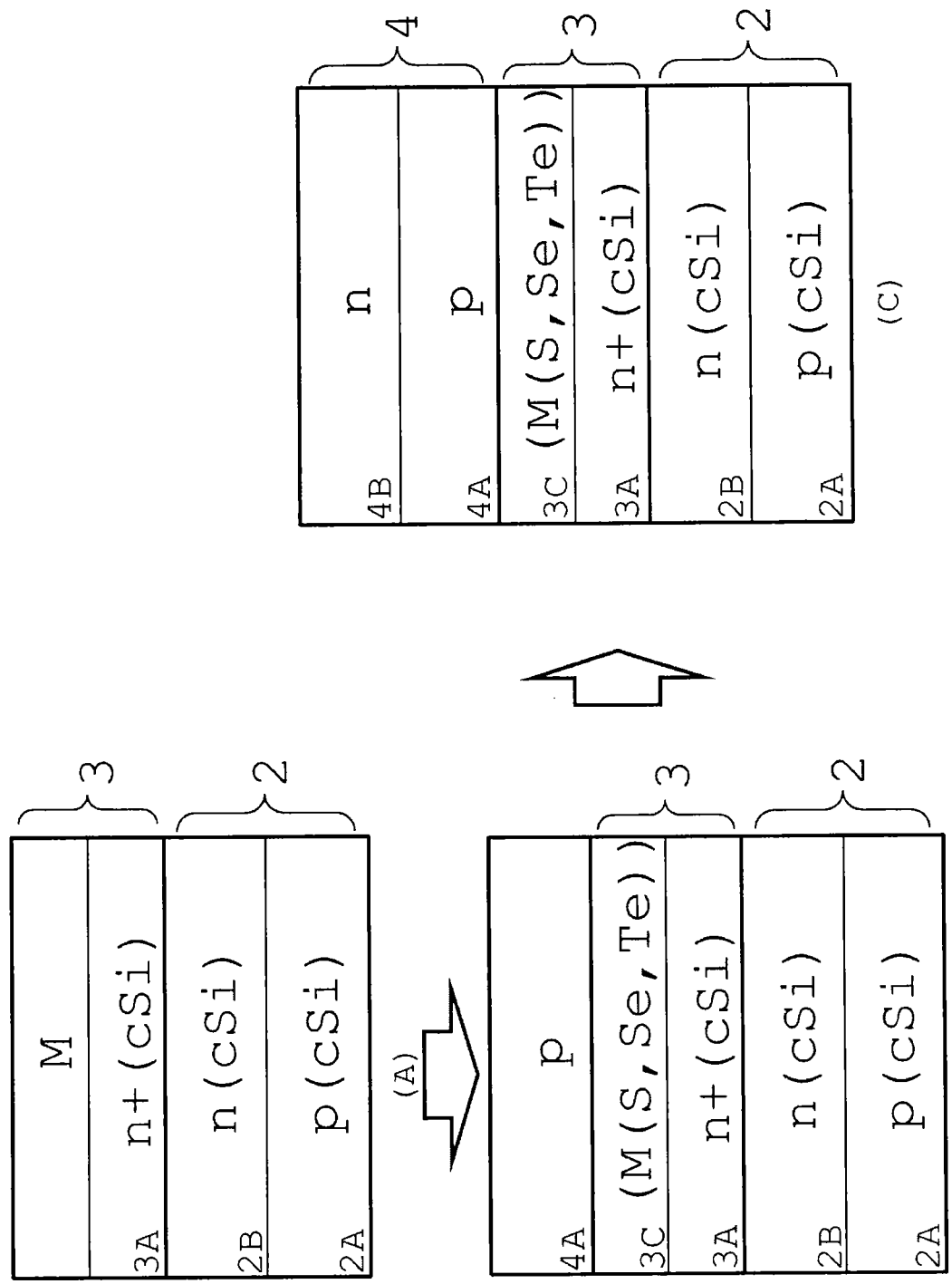
FIG. 10 is a cross-sectional conceptual diagram illustrating the manufacturing processes of a solar cell according to an embodiment.

FIG. 10A as a conceptual diagram shows a process in which a thin film of metal M is deposited on the $n^+$-type sublayer 3A of the intermediate layer 3 in FIG. 9E. The deposition of the metal M thin film is carried out by CVD or a sputtering method, for example.

FIG. 10B as a conceptual diagram shows a process in which the p-type compound semiconductor sublayer 4A is deposited on the metal M thin film in FIG. 10A. The method for the deposition is similar to that for the process in FIG. 9H. In this process, the metal M thin film and the group VI element react with each other, so that the metal M thin film becomes an M (S, Se, Te) sublayer 3B. In the meanwhile, part of the metal M which has not reacted remains in the M (S, Se, Te) sublayer 3C in some cases. Alternatively, the M (S, Se, Te) sublayer 3C may be formed by sputtering the metal M and at least one element selected from S, Se, and Te.

FIG. 10C as a conceptual diagram shows a process in which the sublayer 4B of the second solar cell 4 is deposited on the p-type sublayer 4A in FIG. 10B. The deposition of the n-type sublayer 4B is carried out by a sputtering method or a vacuum deposition method, for example. In the end, the back electrode 1 and the transparent electrode 5 are formed, so that the solar cell of FIG. 6 can be obtained.

Examples of the embodiment will be hereinafter described in detail with reference to the drawings. The present disclosure is not limited to the examples described later.

EXAMPLE 1

Figure 11:
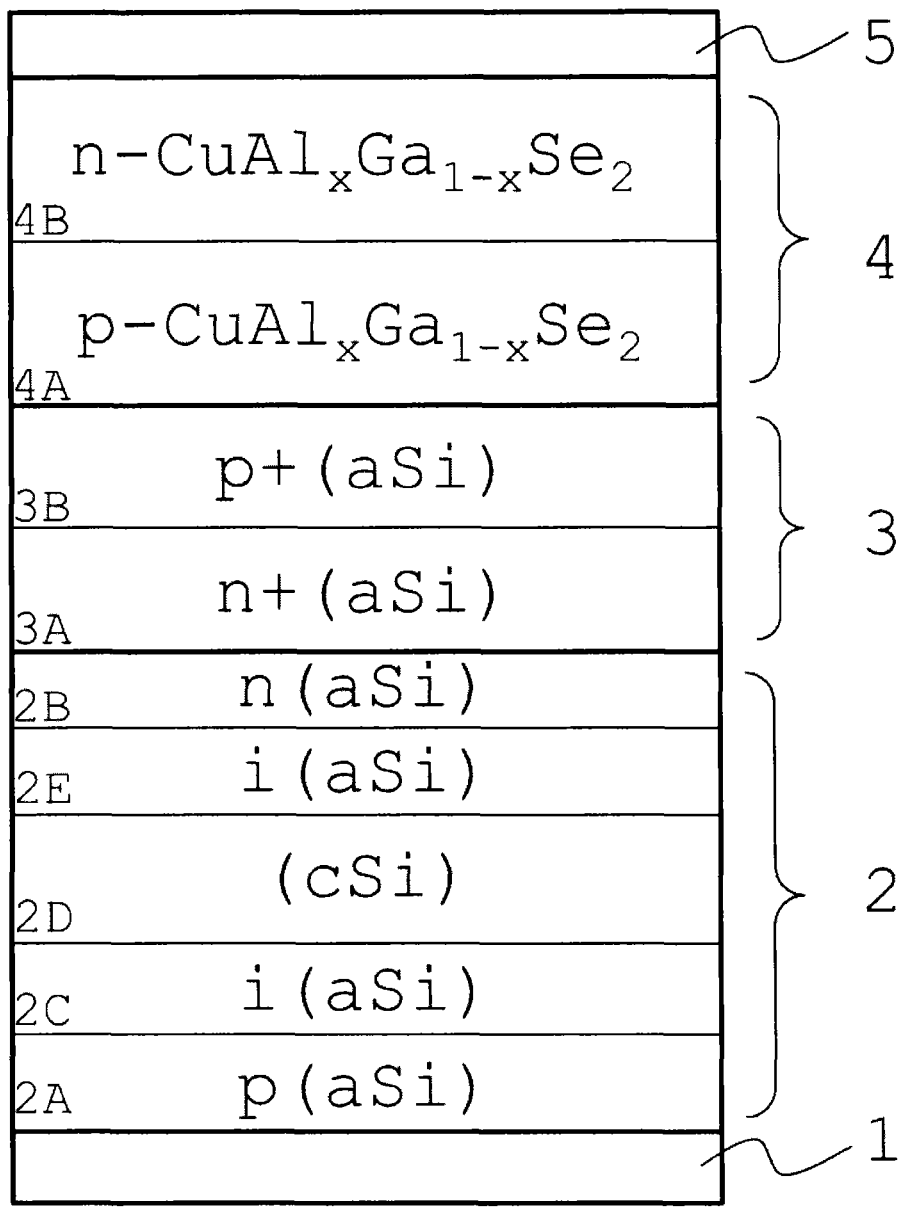
FIG. 11 is a cross-sectional conceptual diagram illustrating a solar cell according to an embodiment.

A solar cell illustrated in FIG. 11 will be described. In the solar cell illustrated in FIG. 11, the first solar cell 2, which is a bottom cell, has a pin structure in which a non-doped amorphous Si (i (aSi)) sublayer 2E and the n-type amorphous Si (n (aSi)) sublayer 2B are sequentially deposited on the surface of a monocrystal p-type amorphous Si (cSi) sublayer 2D. The i (aSi) sublayer 2E and the n (aSi) sublayer 2B are formed by a PE-CVD method. The purpose for insertion of the i (aSi) layer 2E is to prevent occurrence of recombination due to defects in the surfaces of the Si crystals.

The first solar cell 2 is provided with a BSF (back surface field) structure in which the non-doped amorphous Si (i (aSi)) sublayer 2C and the p-type amorphous Si (p (aSi)) sublayer 2A are deposited on the back surface of the above structure according to need. The (i (aSi)) sublayer 2C and the (p (aSi)) sublayer 2A are formed by a PE-CVD method. The purpose for insertion of the (i (aSi)) sublayer 2C into the BSF structure is to prevent occurrence of recombination due to defects in the surfaces of the Si crystals, as previously described.

The intermediate layer 3 is formed by sequentially depositing the $n^+$-type amorphous Si ($n^+$ (aSi)) sublayer 3A and the $p^+$-type amorphous Si ($p^+$ (aSi)) sublayer 3B on the n (aSi) sublayer in the surface of the first solar cell 2. Both sublayers 3A and 3B are 20 nm in thickness. The respective doping concentrations for the sublayers 3A and 3B are $1.1 \times 10^{20}/cm^3$ and $1.5 \times 10^{20}/cm^3$ For the second solar cell 4, $CuAl_xGa_{1-x}Se_2$ solar cell as a group I-III-VI$_2$ compound is used. A p-type $CuAl_xGa_{1-x}Se_2$ layer is deposited on the $p^+$ (aSi) sublayer 3B in the surface of the intermediate layer 3 and is converted into n-type in the surface of the p-type $CuAl_xGa_{1-x}Se_2$ layer by a liquid-phase doping method, so that a pn structure is formed of a p-CuAl$_x$Ga$_{1-x}$Se$_2$ sublayer 4A and a n-CuAl$_x$Ga$_{1-x}$Se$_2$ sublayer 4B. The p-CuAl$_x$Ga$_{1-x}$Se$_2$ sublayer is obtained by forming a CuAl$_x$Ga$_{1-x}$ layer by a sputtering method and making the layer into a selenium-based layer in a gas of selenium hydride.

Moreover, a ZnO film and an Al film are formed for the transparent electrode 5 and the back electrode 1, respectively, and the tandem solar cell of Example 1 is finally obtained.

The irradiation of the tandem solar cell of Example 1 with 1-sun solar simulator light achieves a Voc of 2 V and a conversion efficiency of 30%. For comparison, a solar cell that does not have the intermediate layer and is otherwise similar in the structure to the solar cell of Example 1 is irradiated with 1-sun solar simulator light, and the Voc and conversion efficiency are measured. As a result, a Voc of 0.9 V and a conversion efficiency of 14%, which are half of the performances obtained for the solar cell of Example 1, are observed. As shown in the embodiment, the use of an appropriate intermediate layer permits a solar cell to be obtained that simultaneously attains high efficiency and low cost and has suppressed counter electromotive force, the cell including Si and a group I-III-VI$_2$ compound.

EXAMPLE 2

Figure 12:
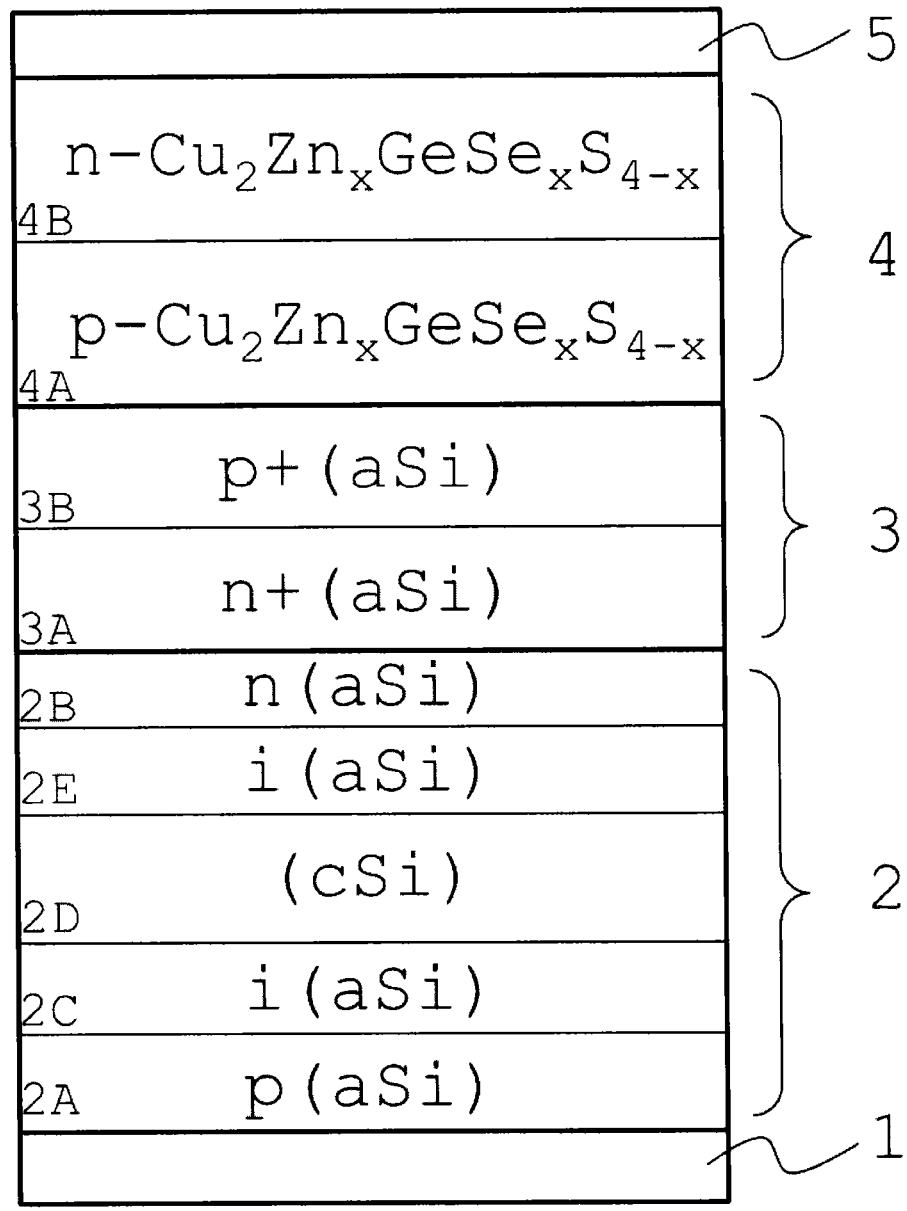
FIG. 12 is a cross-sectional conceptual diagram illustrating a solar cell according to an embodiment.

A solar cell illustrated in FIG. 12 will be described. The solar cell of FIG. 12 is similar to the solar cell of Example 1 in the structure of the first solar cell 2 as a bottom cell and the intermediate layer 3 and is different in the structure of the second solar cell 4 as a top cell. For the second solar cell 4, Cu$_2$ZnGeSe$_x$S$_{4-x}$ solar cell as a group I$_2$-II-IV-VI$_4$ compound is used. A p-type Cu$_2$ZnGeSe$_x$S$_{4-x}$ layer is deposited on the p$^+$ (aSi) sublayer 3B in the surface of the intermediate layer 3, and is converted into n-type in the surface of the p-type Cu$_2$ZnGeSe$_x$S$_{4-x}$ layer by a liquid-phase doping method, so that a pn structure is formed of a p-Cu$_2$ZnGeSe$_x$S$_{4-x}$ sublayer 4A and a n-Cu$_2$ZnGeSe$_x$S$_{4-x}$ sublayer 4B. The p-Cu$_2$ZnGeSe$_x$S$_{4-x}$ sublayer is obtained by forming a Cu$_2$ZnGe layer by a sputtering method and making the layer into a selenium and sulfide-based layer in gases of selenium hydride and hydrogen sulfide.

The irradiation of the tandem solar cell of Example 2 with 1-sun solar simulator light achieves a Voc of 1.8 V and a conversion efficiency of 27%. For comparison, a solar cell that does not have the intermediate layer and is otherwise similar in the structure to the solar cell of Example 2 is irradiated with 1-sun solar simulator light, and the Voc and conversion efficiency are measured. As a result, a Voc of 0.8 V and a conversion efficiency of 13%, which are half of the performances obtained for the solar cell of Example 2, are observed. As shown in the embodiment, the use of an appropriate intermediate layer permits a solar cell to be obtained that simultaneously attains high efficiency and low cost and has suppressed counter electromotive force, the cell including Si and a group I$_2$-II-IV-VI$_4$ compound.

EXAMPLE 3

Figure 13:
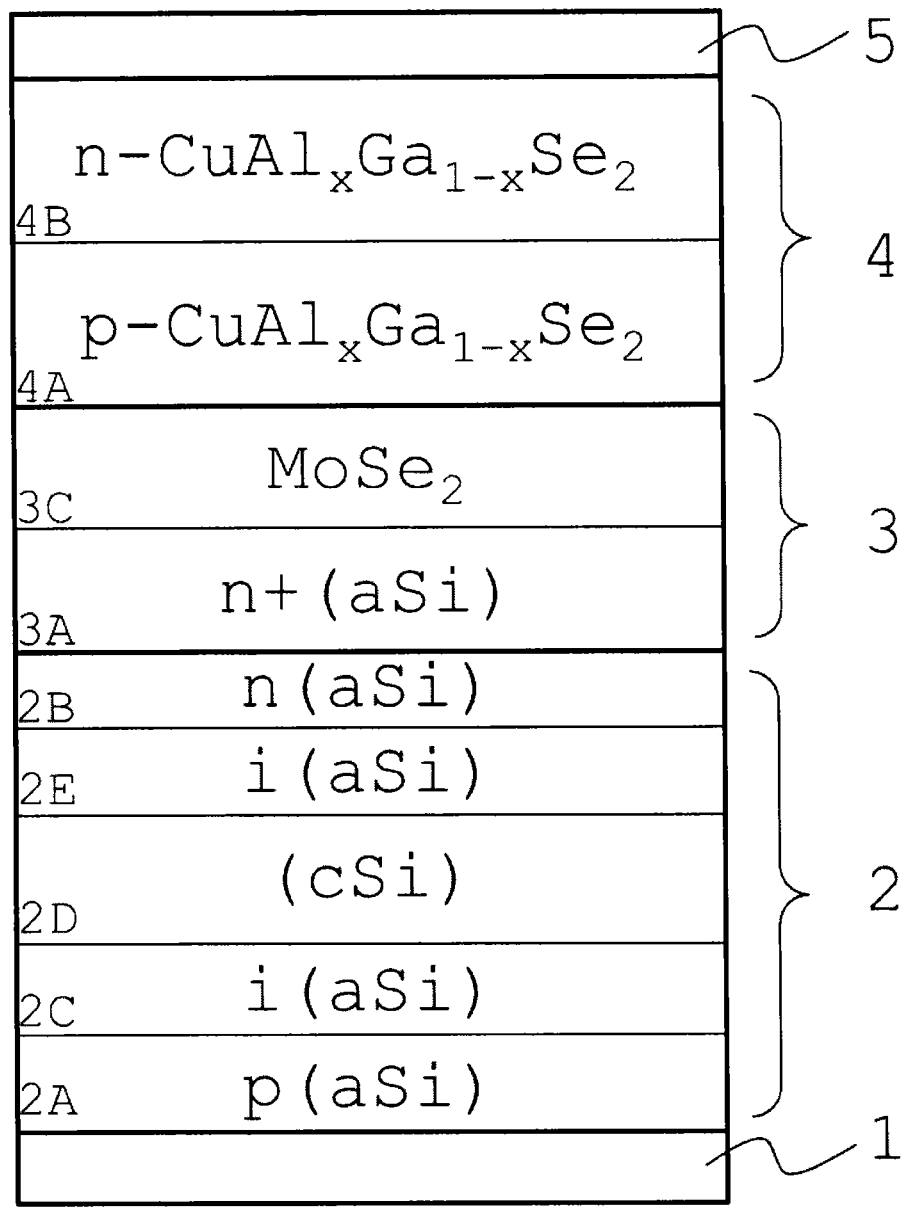
FIG. 13 is a cross-sectional conceptual diagram illustrating a solar cell according to an embodiment.

A solar cell illustrated in FIG. 13 will be described. The solar cell of Example 3 is similar to the solar cell of Example 1 in the structure of the first solar cell 2 as a bottom cell and the second solar cell 4 as a top cell and is different in the structure of the intermediate layer 3. The intermediate layer 3 is formed by sequentially depositing the n$^+$ (aSi) sublayer 3A and the MoSe$_2$ sublayer 3C on the n (aSi) sublayer 2B in the surface of the first solar cell 2. The n$^+$ (aSi) sublayer 3A and the MoSe$_2$ sublayer 3C are 20 nm and 10 nm in thickness, respectively, and the n$^+$ (aSi) sublayer 3A has a doping concentration of 1×10$^{20}$/cm$^3$.

The MoSe$_2$ sublayer 3C is obtained by forming an Mo super-thin film (3-4 nm) on the n$^+$ (aSi) sublayer 3A of the intermediate layer 3 by sputtering, and thereafter the p-CuAl$_x$Ga$_{1-x}$Se$_2$ sublayer 4A of the second solar cell 4 is formed. Through observation of the intermediate layer (contact layer) structure with a cross-section TEM (transmission electron microscope), the MoSe$_2$ sublayer 3C is confirmed between the n$^+$ (aSi) sublayer 3A and the p-CuAl$_x$Ga$_{1-x}$Se$_2$ sublayer 4A. The other sublayers can be analyzed and confirmed by TEM or TEM-EDX (Energy Dispersive X-ray spectrometry).

The irradiation of the tandem solar cell of Example 3 with 1-sun solar simulator light achieves a Voc of 1.9 V and a conversion efficiency of 28.5%. As shown in the embodiment, the use of an appropriate intermediate layer permits a solar cell to be obtained that simultaneously attains high efficiency and low cost and has suppressed counter electromotive force, the cell including Si and a group I-III-VI$_2$ compound.

EXAMPLE 4

The solar cell of Example 4 is similar to the solar cell of Example 3 in the structure of the first solar cell 2 as a bottom cell and the second solar cell 4 as a top cell and is different in that various types of compounds are used for the metal compound thin film (a layer of metal and a group VI element compound) of the intermediate layer 3. This is the example of embodying a structure including the layer of metal and a group VI element compound and an n$^+$-type Si layer (where the metal M is Nb, Mo, Pd, Ta, W, or Pt, and the group VI element is S, Se, or Te) in the intermediate layer 3.

Table 1 shows the results of irradiating the tandem solar cell of Example 4 with 1-sun solar simulator light. In the table, M denotes a metal element. When any of an Nb compound, an Mo compound, a Pd compound, a Ta compound, a W compound, and a Pt compound indicated by circles is used, high-level Vocs and high efficiencies exceeding 20% can be obtained. As shown in the embodiment, the use of an appropriate intermediate layer permits a solar cell to be obtained that simultaneously attains high efficiency and low cost and has suppressed counter electromotive force, the cell including Si and a group I-III-VI$_2$ compound.

EXAMPLE 5

Figure 14:
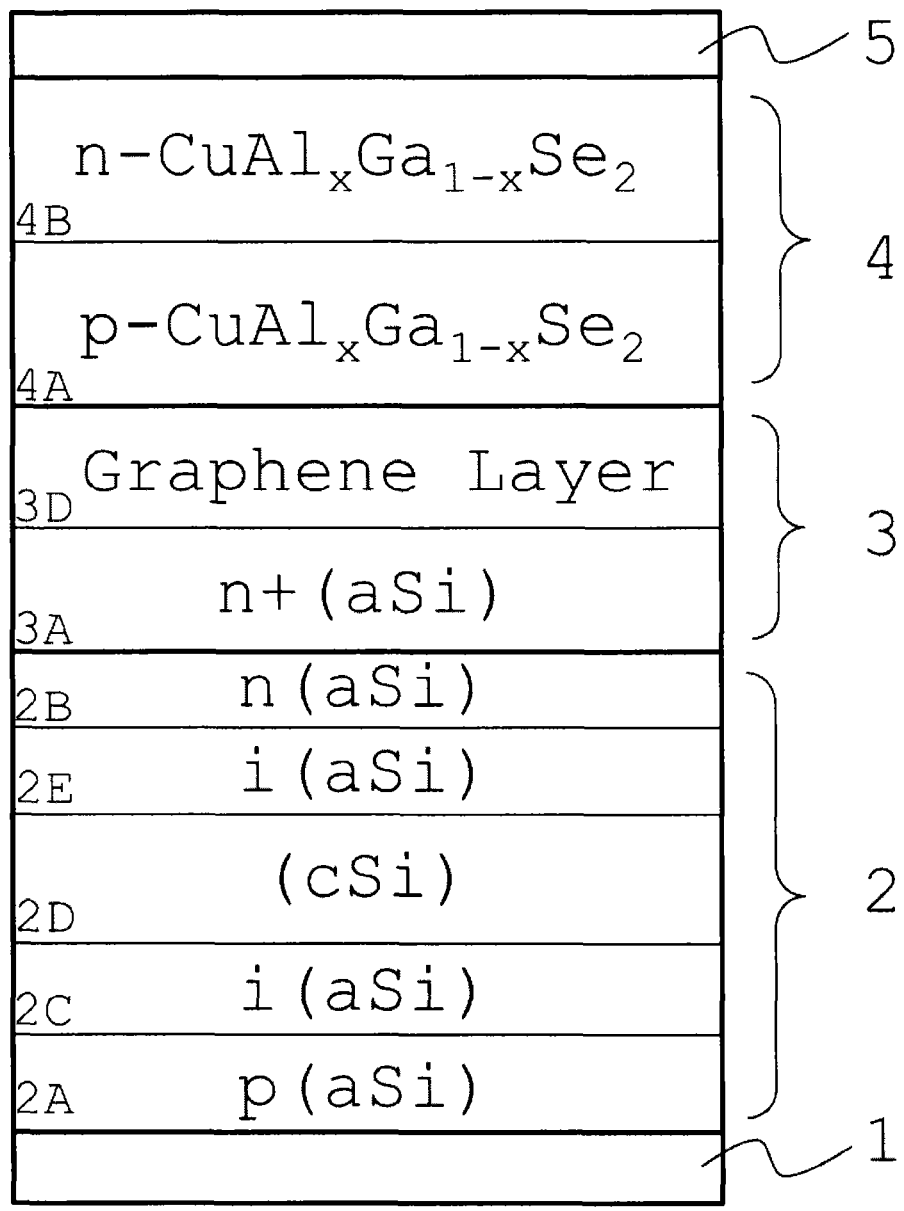
FIG. 14 is a cross-sectional conceptual diagram illustrating a solar cell according to an embodiment.

The solar cell of Example 5, which is illustrated in FIG. 14 as a conceptual diagram, is similar to the solar cell of Example 3 in the structure of the first solar cell 2 as a bottom cell and the second solar cell 4 as a top cell and is different in the structure of the intermediate layer 3. The intermediate layer 3 is formed by sequentially depositing the n$^+$-type amorphous Si (n$^+$ (aSi)) sublayer 3A and the graphene sublayer 3D on the n (aSi) sublayer 2B in the surface of the first solar cell 2. The sublayers 3A and 3D are 20 nm and 2 nm in thickness, respectively. The doping concentration for the n$^+$ (aSi) sublayer 3A is 1×10$^{20}$/cm$^3$.

The graphene sublayer 3D is obtained by forming a film on a substrate by thermal CVD and transferring the film onto the n$^+$ (aSi) sublayer 3A of the intermediate layer 3, and thereafter the p-CuAl$_x$Ga$_{1-x}$Se$_2$ sublayer 4A of the second solar cell 4 is formed. Through observation of the intermediate layer (contact layer) structure with a cross-section TEM, the graphene sublayer 3D, in other words, a layered material is confirmed between the n+ (aSi) sublayer 3A and the p-CuAl$_x$Ga$_{1-x}$Se$_2$ sublayer 4A. The irradiation of the tandem solar cell of Example 5 with 1-sun solar simulator light achieves a Voc of 1.8 V and an conversion efficiency of 28%. As shown in the embodiment, the use of an appropriate intermediate layer permits a solar cell to be obtained that simultaneously attains high efficiency and low cost and has suppressed counter electromotive force, the cell including Si and a group I-III-VI$_2$ compound.

TABLE 1

|  | EFFICIENCY (%) | OPEN CIRCUIT VOLTAGE (V) | EVALUATION |
|---|---|---|---|
| M SULFIDE LAYER |  |  |  |
| Mg/S | 3.5 | 1.16 |  |
| Ca/S | 3.9 | 1.22 |  |
| Ti/S | 15.6 | 1.62 |  |
| V/S | 12.0 | 1.54 |  |
| Cr/S | 18.9 | 1.65 |  |
| Mn/S | 16.3 | 1.60 |  |
| Fe/S | 9.6 | 1.36 |  |
| Co/S | 7.6 | 1.28 |  |
| Ni/S | 7.1 | 1.29 |  |
| Zn/S | 4.6 | 1.12 |  |
| Ge/S | 5.6 | 1.68 |  |
| As/S | 15.8 | 1.70 |  |
| Sr/S | 5.4 | 1.66 |  |
| Zr/S | 7.6 | 1.49 |  |
| Nb/S | 27.6 | 1.84 | Excellent |
| Mo/S | 28.1 | 1.87 | Excellent |
| Pd/S | 28.0 | 1.87 | Excellent |
| Sn/S | 13.0 | 1.50 |  |
| Sb/S | 11.6 | 1.44 |  |
| Ba/S | 8.5 | 1.28 |  |
| Ta/S | 28.0 | 1.87 | Excellent |
| W/S | 28.3 | 1.89 | Excellent |
| Pt/S | 27.7 | 1.85 | Excellent |
| Bi/S | 4.4 | 1.15 |  |
| M SELENE LAYER |  |  |  |
| Mg/Se | 4.0 | 1.19 |  |
| Ca/Se | 4.3 | 1.26 |  |
| Ti/Se | 16.5 | 1.63 |  |
| V/Se | 12.9 | 1.58 |  |
| Cr/Se | 19.5 | 1.69 |  |
| Mn/Se | 17.2 | 1.67 |  |
| Fe/Se | 11.1 | 1.40 |  |
| Co/Se | 8.5 | 1.31 |  |
| Ni/Se | 8.1 | 1.35 |  |
| Zn/Se | 4.1 | 1.07 |  |
| Ge/Se | 5.4 | 1.70 |  |
| As/Se | 17.4 | 1.75 |  |
| Sr/Se | 6.2 | 1.68 |  |
| Zr/Se | 8.4 | 1.51 |  |
| Nb/Se | 27.6 | 1.84 | Excellent |
| Mo/Se | 28.5 | 1.90 | Excellent |
| Pd/Se | 28.3 | 1.89 | Excellent |
| Sn/Se | 15.5 | 1.61 |  |
| Sb/Se | 12.7 | 1.49 |  |
| Ba/Se | 9.5 | 1.33 |  |
| Ta/Se | 28.5 | 1.90 | Excellent |
| W/Se | 29.0 | 1.93 | Excellent |
| Pt/Se | 28.8 | 1.92 | Excellent |
| Bi/Se | 4.8 | 1.21 |  |
| M TELLBIUM LAYER |  |  |  |
| Mg/Te | 3.8 | 1.18 |  |
| Ca/Te | 4.0 | 1.24 |  |
| Ti/Te | 15.8 | 1.62 |  |
| V/Te | 12.4 | 1.55 |  |
| Cr/Te | 19.1 | 1.66 |  |
| Mn/Te | 16.8 | 1.62 |  |
| Fe/Te | 10.8 | 1.41 |  |
| Co/Te | 8.1 | 1.29 |  |
| Ni/Te | 7.3 | 1.30 |  |
| Zn/Te | 4.0 | 1.06 |  |
| Ge/Te | 5.4 | 1.69 |  |
| As/Te | 16.5 | 1.72 |  |
| Sr/Te | 5.6 | 1.65 |  |
| Zr/Te | 7.5 | 1.50 |  |
| Nb/Te | 27.9 | 1.86 | Excellent |
| Mo/Te | 28.0 | 1.87 | Excellent |
| Pd/Te | 27.6 | 1.84 | Excellent |
| Sn/Te | 13.7 | 1.50 |  |
| Sb/Te | 11.9 | 1.44 |  |
| Ba/Te | 8.9 | 1.28 |  |
| Ta/Te | 27.5 | 1.83 | Excellent |
| W/Te | 28.0 | 1.87 | Excellent |
| Pt/Te | 27.6 | 1.84 | Excellent |
| Bi/Te | 4.5 | 1.15 |  |

As described above, according to the embodiment, the use of the n+-type Si sublayer and at least one selected from the p+-type Si sublayer, the metal compound sublayer, and the graphene sublayer for the intermediate layer, the metal compound layer being represented by MX where M denotes at least one type of element selected from Nb, Mo, Pd, Ta, W, and Pt and X denotes at least one type of element selected from S, Se, and Te, makes it possible to provide a solar cell that simultaneously attains high efficiency and low cost and has suppressed counter electromotive force, the cell including Si and one of a group I-III-VI$_2$ compound and a group I$_2$-II-IV-VI$_4$ compound.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A solar cell, comprising:
a first solar cell;
a second solar cell; and
an intermediate layer between the first and second solar cells,
the first solar cell including a Si layer as a light absorbing layer, the second solar cell including as a light absorbing layer one of a group I-III-VI$_2$ compound layer and a group I$_2$-II-IV-VI$_4$ compound layer, and the intermediate layer including an n+-type Si sublayer and a metal compound sublayer,
wherein the metal compound sublayer is represented by MX where M denotes at least one type of element selected from Nb, Mo, Pd, Ta, W, and Pt and X denotes at least one type of element selected from S, Se, and Te excluding a compound of M being Mo and X being Se,
the Si layer of the first solar cell is a narrow-gap light absorbing layer,
the one of a group I-III-VI$_2$ compound layer and a group I$_2$-II-IV-VI$_4$ compound layer of the second solar cell is a wide-gap light absorbing layer, the first solar cell, the n⁺-type Si sublayer, the metal compound sublayer, and the second solar cell are stacked in this order, a surface of the metal compound sublayer facing to the second solar cell is in direct contact with a surface of the light absorbing layer of the second solar cell facing to the metal compound sublayer, and the n⁺-type Si sublayer and the metal compound sublayer are conductive layers.

2. The solar cell according to claim 1, wherein the first solar cell has an n-type layer and a p-type layer, the n-type layer being in direct contact with the n⁺-type Si sublayer, and the second solar cell has an n-type layer and a p-type layer, the p-type layer being in direct contact with the metal compound sublayer.

3. The solar cell of claim 2, wherein the n⁺-type Si sublayer has doping concentrations in a range of $10^{19}/cm^3$ to $10^{21}/cm^3$, both inclusive.

4. The solar cell of claim 1, wherein the thickness of the intermediate layer ranges from 5 nm to 50 nm, both inclusive.

5. The solar cell of claim 1, wherein the thickness of the intermediate layer ranges from 5 nm to 20 nm, both inclusive.

6. The solar cell of claim 1, wherein the first solar cell has a structure in which a p-type amorphous Si layer, an i-type amorphous Si layer, a crystalline Si layer, an i-type amorphous Si layer, and an n-type amorphous Si layer are sequentially laminated.

7. The solar cell of claim 1, wherein the first solar cell is a bottom cell of the solar cell, and the second solar cell is a top cell of the solar cell.

8. The solar cell of claim 1, further comprising a first electrode and a second electrode, wherein the first solar cell is between the first electrode and the intermediate layer, the second solar cell is between the second electrode and the intermediate layer, and the second electrode is a transparent electrode.

9. The solar cell of claim 1, wherein the n⁺-type Si sublayer is an amorphous silicon layer or a crystalline silicon layer.

10. The solar cell of claim 8, wherein the first solar cell includes a n-type Si layer and a p-type Si layer, and the p-type Si layer of the first solar cell is between the n-type Si layer of the first solar cell and the first electrode.

11. The solar cell of claim 8, wherein the second solar cell includes a one of a n-type group I-III-VI₂ compound layer and a n-type group I₂-II-IV-VI₄ compound layer and a one of a p-type group I-III-VI₂ compound layer and a p-type group I₂-II-IV-VI₄ compound layer, and the one of a n-type group I-III-VI₂ compound layer and a n-type group I₂-II-IV-VI₄ compound layer of the second solar cell is between the one of a p-type group I-III-VI₂ compound layer and a p-type group I₂-II-IV-VI₄ compound layer of the second solar cell and the second electrode layer.

12. The solar cell of claim 10 wherein the n-type Si layer of the first solar cell is an amorphous silicon layer or a crystalline silicon layer, and the p-type Si layer of the first solar cell is an amorphous silicon layer or a crystalline silicon layer.

13. The solar cell of claim 7, wherein a side of the top cell is irradiated with a light.

14. The solar cell according to claim 1, wherein the intermediate layer includes the n⁺-type Si sublayer and the metal compound sublayer, the n⁺-type Si sublayer and the metal compound sublayer are laminated.

15. The solar cell according to claim 1 wherein the n⁺-type Si sublayer is in physical contact with the metal compound sublayer.

16. The solar cell according to claim 1 wherein the n⁺-type Si sublayer is in physical contact with the metal compound sublayer, the first solar cell has an n-type layer and a p-type layer, the n-type layer being in direct contact with the n⁺-type Si sublayer, and the second solar cell has an n-type layer and a p-type layer, the p-type layer being in direct contact with the metal compound sublayer.

* * * * *